United States Patent
Hess et al.

(10) Patent No.: US 10,453,505 B2
(45) Date of Patent: Oct. 22, 2019

(54) PULSED SUB-VDD PRECHARGING OF A BIT LINE

(71) Applicant: Apple Inc., Cupertino, CA (US)

(72) Inventors: Greg M. Hess, Mountain View, CA (US); Hemangi U. Gajjewar, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/912,449

(22) Filed: Mar. 5, 2018

(65) Prior Publication Data
US 2019/0272859 A1   Sep. 5, 2019

(51) Int. Cl.
*G11C 7/00* (2006.01)
*G11C 7/12* (2006.01)
*G11C 5/14* (2006.01)
*G11C 11/419* (2006.01)

(52) U.S. Cl.
CPC .............. *G11C 7/12* (2013.01); *G11C 5/147* (2013.01); *G11C 11/419* (2013.01)

(58) Field of Classification Search
CPC ..... G11C 7/22; G11C 7/1048; G11C 11/4094; G11C 11/4091; G11C 7/12

USPC ....................................................... 365/203
See application file for complete search history.

(56) References Cited

U.S. PATENT DOCUMENTS

| | | | | |
|---|---|---|---|---|
| 7,385,865 B2 * | 6/2008 | Khellah | ................ | G11C 11/419 365/154 |
| 7,570,527 B2 | 8/2009 | Houston | | |
| 8,279,687 B2 | 10/2012 | Adams et al. | | |
| 9,508,405 B2 | 11/2016 | Jain et al. | | |
| 9,514,805 B1 * | 12/2016 | Pallerla | ................. | G11C 11/419 |
| 9,601,186 B2 | 3/2017 | Harada et al. | | |
| 2006/0274587 A1 * | 12/2006 | Houston | ................... | G11C 7/12 365/203 |

* cited by examiner

*Primary Examiner* — Son T Dinh
(74) *Attorney, Agent, or Firm* — Meyertons, Hood, Kivlin, Kowert & Goetzel, P.C.

(57) ABSTRACT

An apparatus is disclosed, including a plurality of memory cells, in which a given memory cell is coupled to a true bit line, a complement bit line, and a power supply signal. The apparatus also includes a pre-charge circuit that is configured to charge, for a first duration, the true bit line and the complement bit line to a voltage level that is less than a voltage level of the power supply signal. The pre-charge circuit is also configured to maintain, for a second duration that is longer than the first duration, the voltage level on the true bit line and the complement bit line.

20 Claims, 6 Drawing Sheets

PULSED SUB-VDD PRECHARGING OF A BIT LINE

BACKGROUND

Technical Field

Embodiments described herein relate to integrated circuits, and more particularly, to techniques for pre-charging a bit line in a memory array.

Description of the Related Art

Random access memories (RAMs) may be found in a wide variety of integrated circuits (ICs). In various RAM circuits, a bit line is coupled to a column of memory cells and charged to a particular voltage level prior to a read operation. This charging operation is referred to herein as a "bit line pre-charge" operation. Once the bit lines in a memory have been charged to a particular voltage level, the pre-charge operation is disabled and a selected memory cell may be read or written. Depending on a data value stored in the memory cell, the pre-charged bit line is either left in a charged, logic high state or discharged to a logic low state.

SUMMARY OF THE EMBODIMENTS

Various embodiments of systems and methods for delaying signal propagation in a multiple power domain circuit are disclosed. Broadly speaking, embodiments of an apparatus and a method are contemplated in which the apparatus may include a plurality of memory cells, wherein a given memory cell is coupled to a true bit line, a complement bit line, and a power supply signal. The apparatus may also include a pre-charge circuit that may be configured to charge, for a first duration, the true bit line and the complement bit line to a voltage level that is less than a voltage level of the power supply signal. The pre-charge circuit may also be configured to maintain, for a second duration that is longer than the first duration, the voltage level on the true bit line and the complement bit line.

In another embodiment, a method may include operations including charging, by a first device included in a pre-charge circuit, for a first duration, a true bit line coupled to one or more memory cells of a memory array, to a particular voltage level. The particular voltage level may be less than a voltage level of a power supply signal coupled to the one or more memory cells. The first duration may be less than a duration of a pre-charge phase of a memory access cycle. The method may also include maintaining the particular voltage level on the true bit line utilizing a second device for the duration of the pre-charge phase.

In an embodiment of a particular apparatus, the particular apparatus may include a plurality of memory cells and a pre-charge circuit. A given memory cell may be coupled to a bit line and a power supply signal. The pre-charge circuit may be configured to source first and second currents to pre-charge the bit line to a voltage level that is less than a voltage level of the power supply signal. The first and second currents may vary in magnitude and duration.

BRIEF DESCRIPTION OF THE DRAWINGS

The following detailed description makes reference to the accompanying drawings, which are now briefly described.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph (f) interpretation for that unit/circuit/component. More generally, the recitation of any element is expressly intended not to invoke 35 U.S.C. § 112, paragraph (f) interpretation for that element unless the language "means for" or "step for" is specifically recited.

DETAILED DESCRIPTION OF EMBODIMENTS

A memory bit line pre-charge operation may affect access times for a memory. Both a maximum and minimum rate for performing successive data read accesses on a memory may be impacted by the operation of a bit line pre-charge circuit. If there is too little time between read operations, then the bit line may not have enough time to be pre-charged to an adequate voltage level. If there is too much time between read operations, then the bit line may be charged to a higher than desired voltage level.

In order to improve access time of a memory, an embodiment of a bit line pre-charge circuit that is capable of improving both high-speed and low-speed read accesses is contemplated. The embodiments illustrated in the drawings and described below may provide various techniques for enabling a rapid pre-charge operation to support a high rate of read operations while also being capable of sustaining a low rate of read operations without overcharging a bit line.

In addition to supporting a range of memory access times, the disclosed embodiments may also reduce an amount of power consumed during memory operations.

Figure 1:
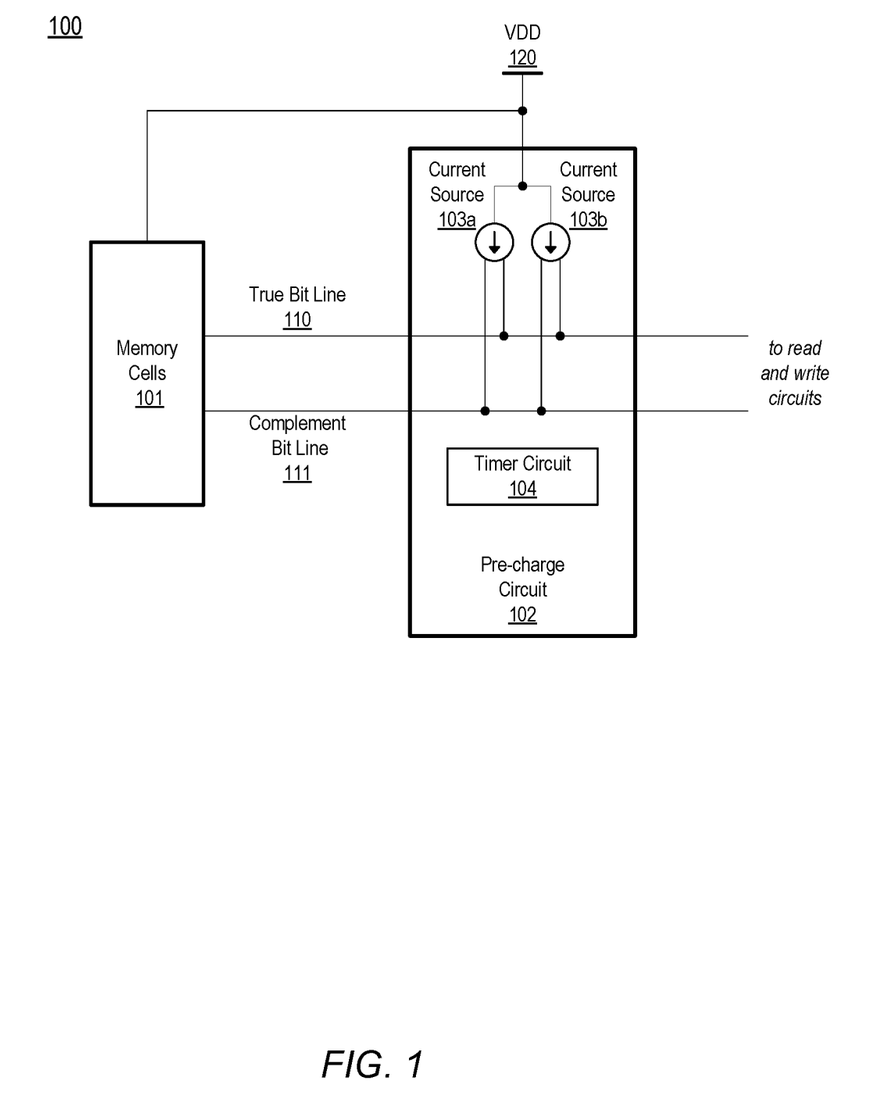
FIG. 1 illustrates an embodiment of a block diagram of a portion of a memory system.

A block diagram of a circuit in memory system is illustrated in FIG. 1. In the illustrated embodiment, memory system 100 includes Memory Cells 101 coupled to Pre-charge Circuit 102 via True Bit Line 110. Pre-charge Circuit 102 includes Current Sources 103a and 103b, referred to collectively as Current Sources 103, as well as Timer Circuit 104. Power is provided to both Memory Cells 101 and Pre-charge Circuit 102 from a power signal, VDD 120.

Memory Cells 101, in the illustrated embodiment, comprise a portion of a memory array, such as, for example, a block or column of memory cells that all share a common bit line and inverse bit line. In the present embodiment, Memory Cells 101 include a column of static random access memory (SRAM) cells. In other embodiments, Memory Cells 101 may correspond to any suitable type of memory cells that utilize a pre-charge circuit. True Bit Line 110 and Complement Bit Line 111 are each coupled to each of the SRAM cells in Memory Cells 101. When a group of memory cells that includes at least one cell within Memory Cells 101 is selected for a read operation, Pre-Charge Circuit 102 charges both True Bit Line 110 and Complement Bit Line 111 to a pre-determined voltage level during a pre-charge phase. In the illustrated embodiment, the pre-determined voltage level is less than a voltage level of VDD 120, referred to herein as a "sub-VDD" voltage level. As used herein, a "pre-charge phase" refers to a time during which a pre-charge circuit provides charge to a bit line between memory reads. In various embodiments, a pre-charge phase may begin in response to an end of a previous read on the bit line, reception of a read request, or any other suitable point in time.

Pre-Charge Circuit 102 utilizes Current Sources 103a and 103b to pre-charge True Bit Line 110 and Complement Bit Line 111 to the sub-VDD voltage level. Current Sources 103a and 103b may be implemented using any suitable type of circuit, such as, a biased metal-oxide semiconductor field-effect transistor (MOSFET), for example. Pre-charge Circuit 102 enables Current Source 103a for a duration that is less than a duration of the pre-charge phase. Current Source 103a, in the illustrated embodiment, is designed to source a sufficient current to each of True Bit Line 110 and Complement Bit Line 111 in a portion of the duration of the pre-charge phase to charge the respective voltage levels of each bit line to the desired sub-VDD voltage level. In some embodiments, Pre-charge Circuit 102 may use Timer Circuit 104 to determine a length of time to enable Current Source 103a. Timer Circuit 104 may correspond to any suitable style of timer circuits, including, for example, circuits that include resistive and capacitive networks or logic-based delay gates.

In parallel with Current Source 103a, Pre-charge Circuit 102 enables Current Source 103b for a duration that is longer than the duration for Current Source 103a. In some embodiments, Current Source 103b may remain enabled for an entirety of the pre-charge phase. Current Source 103b, in one embodiment, is designed to source an amount of current that is approximately equal to an amount of current that leaks through Memory Cells 101 to a ground reference. In such an embodiment, Current Source 103b may source a sufficient current to maintain the sub-VDD voltage level on True Bit Line 110 and Complement Bit Line 111, regardless of a length of a particular pre-charge phase. When the pre-charge phase ends, Pre-charge Circuit 102 disables Current Source 103b and a selected word line is enabled. True Bit Line 110 and Complement Bit Line 111 are allowed to resolve to a logic level that corresponds to a data bit value stored in memory cell that is selected based on the selected word line, and the stored data bit value may be read.

Circuits described above and herein may, in various embodiments, be implemented using devices corresponding to MOSFETs, or to any other suitable type of transconductance device. As used and described herein, a "low logic level," "low," or a "logic 0 value," corresponds to a voltage level sufficiently low to enable a p-channel MOSFET, and a "high logic level," "high," or a "logic 1 value," corresponds to a voltage level sufficiently high to enable an n-channel MOSFET. In various other embodiments, different technology, including technologies other than complementary metal-oxide semiconductor (CMOS), may result in different voltage levels for "low" and "high." A "logic signal," as used herein, may correspond to a signal generated in a CMOS, or other technology, circuit in which the signal transitions between low and high logic levels.

It is noted memory system 100 in FIG. 1 is merely an example. In other embodiments of memory system 100, additional circuit blocks and different configurations of circuit blocks may be implemented dependent upon the specific application for which the memory system is intended.

Figure 2:
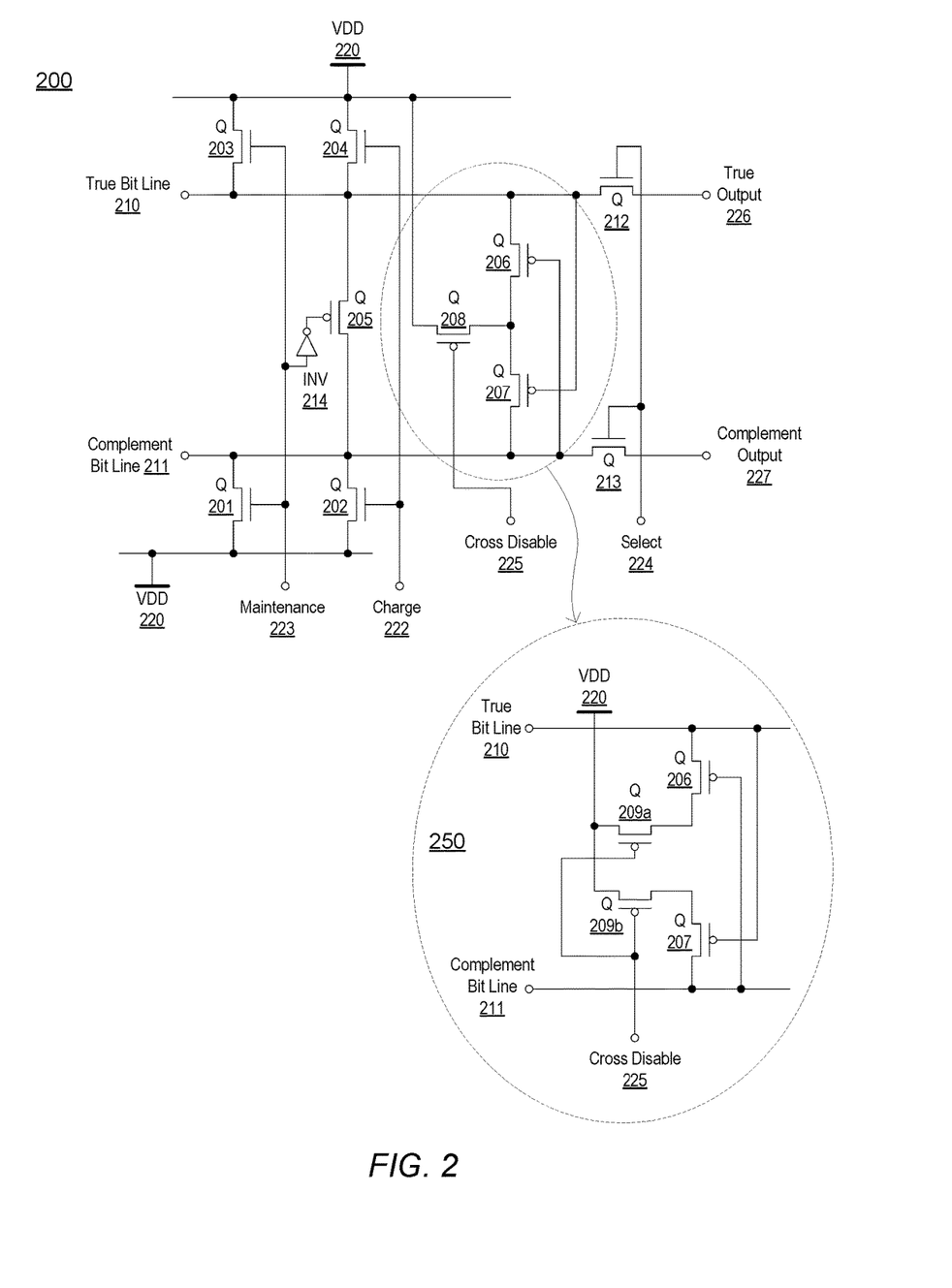
FIG. 2 shows an embodiment of a pre-charge circuit.

Turning to FIG. 2, an embodiment of a pre-charge circuit is shown. In some embodiments, Pre-charge Circuit 200 may correspond to Pre-charge Circuit 102 in FIG. 1. In the illustrated embodiment, Pre-charge Circuit 200 includes transconductance devices Q201 through Q208 and Q212 to Q213, as well as inverter circuit (INV) 214. Pre-charge Circuit 200 is coupled to True Bit Line 210 and Complement Bit Line 211. Power signal VDD 220 supplies power to Pre-charge Circuit 200. Pre-charge Circuit 200 receives input signals Charge 222, Maintenance 223, Select 224, and Cross Disable 225. True Output signal 226 and Complement Output signal 227 are passed through Pre-charge Circuit 200 from a selected memory cell coupled to True Bit Line 210 and Complement Bit Line 211.

In the illustrated embodiment, Pre-charge Circuit 200 sources current to True Bit Line 210 via devices Q203 and Q204, and to Complement Bit Line 211 via devices Q201 and Q202 during a pre-charge phase. The pre-charge phase is used to bring voltage levels of True Bit Line 210 and Complement Bit Line 211 up to a pre-determined sub-VDD level. Devices Q201 through Q204 may, therefore, correspond to Current Sources 103a and 103b in FIG. 1. As used herein, a "transconductance device," or simply "device," refers to a transistor or other type of device that adjusts a level of conductance between two terminals based on a voltage level of a control terminal.

During the pre-charge phase, Complement Bit Line 211 is coupled to True Bit Line 210 via Q205, allowing the respective voltage levels on True Bit Line 210 and Complement Bit Line 211 to equalize. At the beginning of a particular pre-charge phase, Maintenance signal 223 is asserted high, enabling Q201 and Q203. The high level on Maintenance signal 223 also drives the input to INV 214 high, resulting in a low level on the output, thereby enabling Q205. Charge signal 222 is similarly asserted, enabling Q202 and Q204. Q208, in the illustrated embodiment, corresponds to a power gate device for isolating Q206 and Q207 from VDD 220. Cross Disable signal 225 is asserted high, thereby disabling Q208 and decoupling Q206 and Q207 from VDD 220. With both True Bit Line 210 and Complement Bit Line 211 pulled towards a logic high level, and Q208 isolating Q206 and Q207 from VDD 220, Q206 and Q207 are disabled.

Charge signal 222 is de-asserted after being asserted for a brief on-pulse. The length of the on-pulse for Charge signal 222 may be selected based on a combination of contributing factors. For example, factors such as an operating voltage level of VDD 220, a target for the sub-VDD voltage level applied to True Bit Line 210 and Complement Bit Line 211, and resistance values through Q202 and Q204 when enabled. Similarly, Q202 and Q204 may both be designed to have particular resistance values to allow for a suitable on-pulse duration while providing enough current to charge voltage levels of True Bit Line 210 and Complement Bit Line 211 to the sub-VDD level. For example, Q202 and Q204 (as well as Q201 and Q203) may be implemented as n-channel CMOS (NMOS) transistors. Use of n-channel transistors may result in True Bit Line 210 and Complement Bit Line 211 being charged to a desirable sub-VDD voltage level, as opposed to p-channel transistors that may charge the bit lines to a voltage level that is closer to the voltage level of VDD 220. Q202 and Q204 may also be implemented with lower voltage thresholds than an NMOS transistor used to implement Q201 and Q203. The "voltage threshold," of an NMOS transistor refers to a voltage level that, when applied to the control terminal, causes the transistor to be enabled and capable of conducting current between two other terminals of the transistor.

A lower voltage threshold may allow an NMOS transistor to turn-on faster than an NMOS transistor with a higher voltage threshold, thereby allowing more current to pass through in a same amount of time. A lower voltage threshold NMOS transistor, however, may leak more current after voltage levels of True Bit Line 210 and Complement Bit Line 211 reach the desired sub-VDD level. If, for example, True Bit Line 210 and Complement Bit Line 211 are not used for a period of time, then leakage through Q202 and Q204, when enabled, may increase the voltage level of True Bit Line 210 and Complement Bit Line 211 above the sub-VDD level. When Q202 and Q204 are disabled, leakage through these devices is lower and the risk of over-charging the bit lines is reduced. If the voltage level of the bit lines rises above the sub-VDD voltage level, then a next read operation may result in the logic levels of the bit lines taking too long to resolve to the correct states for data in a selected memory cell, and thereby possibly resulting in reading an incorrect data value. Even if a correct data value is read, the higher voltage level of the bit lines may result in extra power being consumed when the bit lines are used to read a selected memory cell. To mitigate against over-charging True Bit Line 210 and Complement Bit Line 211, the length of the assertion of Charge signal 222 may be less than a length of a typical pre-charge phase. A time duration for keeping Charge signal 222 asserted, may be chosen such that Q202 and Q204 may charge True Bit Line 210 and Complement Bit Line 211 to the sub-VDD level and then be disabled. If read operations are performed at a high frequency, such as, for example, at or near a maximum frequency for memory cells coupled to Pre-charge Circuit 200, then the duration for asserting Charge signal 222 may be close to, or equal to the length of the pre-charge phase. When the read frequency is less than the maximum frequency, then the shorter length of the on-pulse may reduce current consumption through Q202 and Q204 and also avoid charging True Bit Line 210 and Complement Bit Line 211 to a voltage level higher than the target sub-VDD voltage level.

After Charge signal 222 is de-asserted, but before the end of the particular pre-charge phase, Maintenance signal 223 remains asserted high, keeping Q201, Q203, and Q205 (via INV 214) enabled. Q203 provides a path from VDD 220 to True Bit Line 210, and Q201 provides a path from VDD 220 to Complement Bit Line 211. Q205 provides a current path between True Bit Line 210 and Complement Bit Line 211 to keep their respective voltage levels substantially the same. Where Q202 and Q204 may each be designed to provide enough current to True Bit Line 210 and Complement Bit Line 211, respectively, to charge each to a voltage level less than the voltage level of the power supply (commonly referred to as a "sub-VDD voltage level"), Q201 and Q203 may instead be designed to provide a current that is substantially equal to an amount of current that may leak through the memory cells coupled, respectively, to True Bit Line 210 and Complement Bit Line 211, without significantly changing current voltage levels of these two bit lines. Design of Q201 and Q203, therefore may be based on a number and type of memory cells coupled to True Bit Line 210 and Complement Bit Line 211, respectively. For example, voltage thresholds of Q201 and Q203 may correspond to voltage thresholds of devices used in the memory cells.

As used herein, "substantially equal," in reference to currents, refers to two or more currents with magnitudes that are approximately equal. For example, the magnitude of the current through Q203 may be chosen to maintain the voltage level on the bit lines within an acceptable range of the desired sub-VDD voltage level. An acceptable range may correspond to a level that remains less than the level of VDD 220 and greater than a level that could cause corruption of data stored in a memory cell coupled to the bit lines.

In the illustrated embodiment, at the end of the particular pre-charge phase, e.g., in response to a read operation, Maintenance signal 223 is de-asserted and Select signal 224 is asserted. True Bit Line 210 and Complement Bit Line 211 resolve to a state representing a data value stored in a selected memory cell. Depending on the stored data value in the cell, a voltage level of either True Bit Line 210 or Complement Bit Line 211 may be pulled from the sub-VDD voltage level towards the level of VDD 220, to a logic high level. The voltage level of the bit line that doesn't go to a logic high, may be pulled towards the ground reference, to a logic low level. In some embodiments, the logic level on True Bit Line 210 and/or Complement Bit Line 211 may be inverted before being sent to the circuit that requested the memory read operation.

During a read operation in the illustrated embodiment, Cross Disable 225 is de-asserted, thereby coupling devices Q206 and Q207 to VDD 220 through Q208. The cross-coupled device Q206 and Q207 may help pull either True Bit Line 210 or Complement Bit Line 211 from the sub-VDD voltage level towards the level of VDD 220. As used herein, "cross-coupled" refers to transconductive devices that are arranged such that an output of a first device is coupled to a control terminal of a second device, and an output of the second device is similarly coupled to a control terminal of the first device. The cross coupling may cause the first device to be disabled when the second device is enabled, and vice versa. These cross-coupled devices may help to pull the bit line that is going to a high state closer to the level of VDD 220. In some embodiments, True Output 226 and Complement Output 227 may be coupled to CMOS logic circuits. Some CMOS logic circuits may not reliably sense a sub-VDD voltage level as a logic high level. Driving the high output signal to the level of VDD 220, therefore, may help drive a proper logic high level to these CMOS circuits and provide more reliable operation.

Sub-circuit 250 shows another implementation for coupling the cross-coupled devices Q206 and Q207 to VDD 220. In sub-circuit 250, device Q208 is replaced with devices Q209a, coupled to Q206, and Q209b, coupled to Q207. Similar to Q208, both Q209a and Q209b are enabled by de-asserting Cross Disable 225. Using individual devices Q209a and Q209b to couple each of Q206 and Q207 to VDD 220 may prevent a weak path between True Bit Line 210 and Complement Bit Line 211 from occurring during a read operation.

It is noted that the signals Charge 222, Maintenance 223, Select 224, and Cross Disable 225 may be generated from logic circuits within Pre-charge Circuit 200, logic circuits in a memory controller external to Pre-charge Circuit 200, or a combination thereof. In addition, Pre-charge Circuit 200, as depicted in FIG. 2, is one example intended to demonstrate concepts disclosed herein. To improve clarity, other circuit elements that may be included in a pre-charge circuit have been omitted. In other embodiments, any number of other circuit elements, such as, e.g., capacitors or additional devices, may be included.

Figure 3:
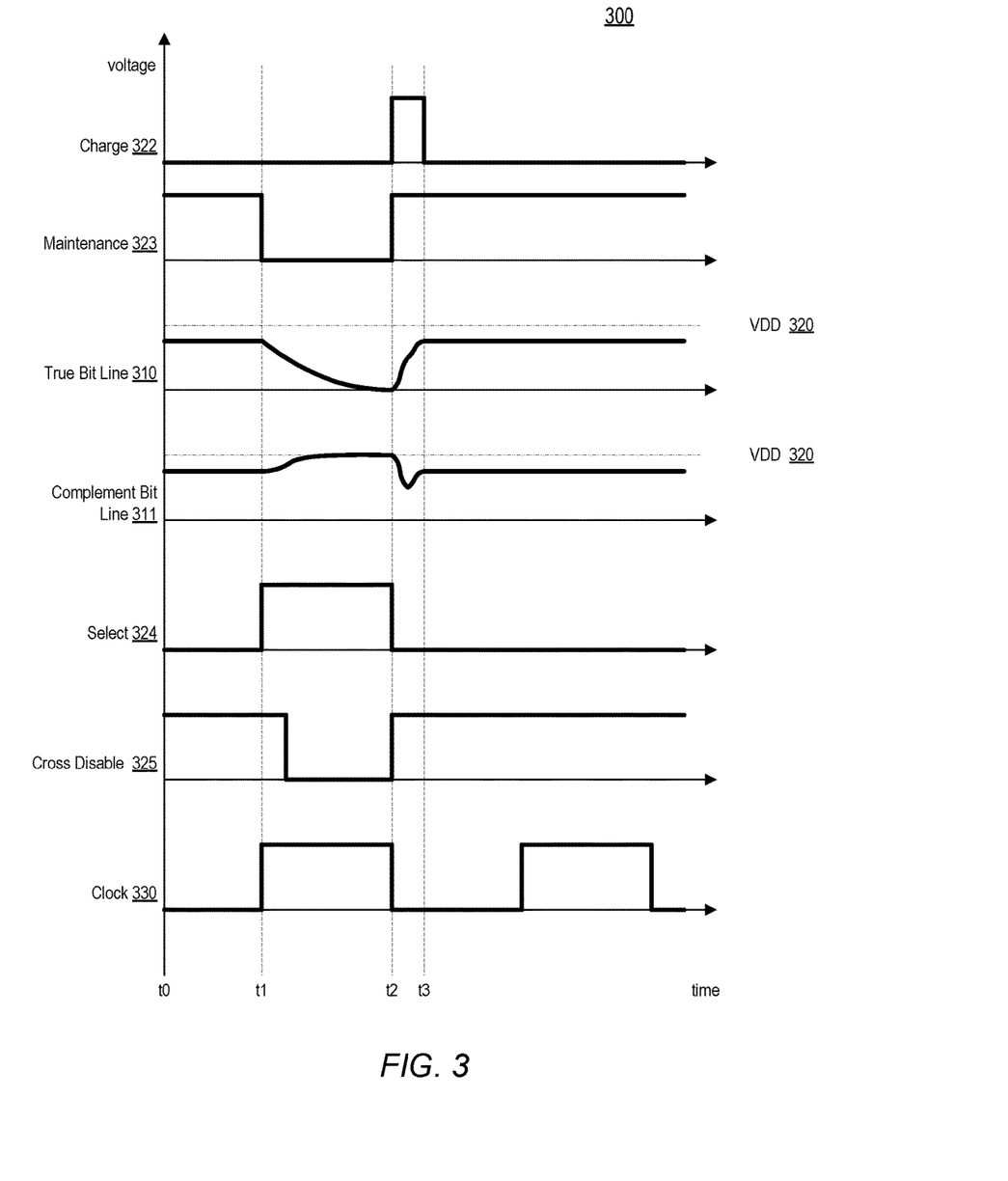
FIG. 3 depicts an embodiment of a chart displaying several waveforms associated with a bit line pre-charge circuit.

Proceeding now to FIG. 3, a chart is depicted that shows example waveforms associated with a pre-charge circuit, such as, for example, Pre-charge Circuit 200 in FIG. 2. Chart 300, in the illustrated embodiment, includes seven waveforms: Charge 322 (corresponding to Charge signal 222), Maintenance 323 (corresponding to Maintenance signal 223), True Bit Line 310 (representing the voltage level on True Bit Line 210), Complement Bit Line 311 (representing the voltage level on Complement Bit Line 211), Select 324 (representing Select signal 224), Cross Disable 325 (representing Cross Disable 225), and Clock 330 that corresponds to a clock signal in a memory system (not shown in FIG. 2). Each of the seven waveforms depicts a voltage level of the respective signal versus time. Referring collectively to FIGS. 2 and 3, Chart 300 starts at time t0 during a pre-charge phase that started prior to time t0.

At time t0, in the illustrated embodiment, True Bit Line 310 and Complement Bit Line 311 have been charged up to a target sub-VDD level that is less a level of a power supply, VDD 320. Charge 322 has been de-asserted, so the voltage level of True Bit Line 310 and Complement Bit Line 311 may not rise to the level of VDD 320 during the current pre-charge phase. Maintenance 323 has been asserted to help maintain this sub-VDD level on the two bit lines. Select 324 is de-asserted, indicating that no memory cells associated with (i.e., coupled to) True Bit Line 310 and Complement Bit Line 311 are currently selected for a read operation.

At time t1, Select 324 is driven high to select an associated memory cell. Timing of the rising transition of Select 324 may be based a corresponding rising transition on Clock signal 330. Maintenance 323 is de-asserted to allow the selected memory cell to drive True Bit Line 310 to a logic level corresponding to a data value stored in the selected memory cell, and to drive Complement Bit Line 311 to a corresponding complementary logic level. In some embodiments, a control circuit that generates Maintenance 323 may be designed to de-assert Maintenance 323 before Select 324 is asserted. Similarly, a circuit that generates Cross Disable 325 may be designed to de-assert Cross Disable 325 after a delay from the rising transition on Select 324. This delay may allow some time for the selected memory cell to begin pulling True Bit Line 310 and Complement Bit Line 311 towards their respective voltage levels. True Bit Line 310 is pulled low by the selected memory cell based on the data stored in the cell, while Complement Bit Line 311 is pulled high. It is noted that, by de-asserting Cross Disable 325, cross coupled devices, such as Q206 and Q207 in FIG. 2, may be enabled to help to pull Complement Bit Line 311 to the level of VDD 320. After the assertion of Select 324, the voltage levels of True Bit Line 310 and/or Complement Bit Line 311 may be read by memory access circuits at some point before time t2. The time period between times t1 and t2 is referred to herein as a current read operation or a "read phase."

At time t2, Select 324 is de-asserted, the read phase ends, and a next pre-charge phase begins. As shown in Chart 300, a pre-charge phase begins at the end of a prior read phase. In some embodiments, the pre-charge phase may also begin at the end of a prior write phase. By pre-charging True Bit Line 310 and Complement Bit Line 311 at the end of a prior read phase, the two bit lines may be pre-charged and ready for a next read phase, as opposed to incurring an additional wait time for a pre-charge phase that is triggered by a subsequent read operation.

In response to the beginning of a next pre-charge phase at time t2, Charge 322 is asserted, resulting in the voltage level of True Bit Line 310 rising towards the sub-VDD target voltage. Maintenance 323 is also asserted at this time, which enables Q205. With Q205 enabled, True Bit Line 310 and Complement Bit Line 311 are coupled together. Since, at time t2, the respective voltage levels of True Bit Line 310 and Complement Bit Line 311 are ground and VDD 320, respectively, charge flows from Complement Bit Line 311 to True Bit Line 310 until the voltage level of each bit line is near one half of the level of VDD 320. Cross Disable 325 is also asserted, decoupling the cross coupled devices, Q206 and Q207. Due to a design of Q202 and Q204 in FIG. 2, the respective voltage levels of True Bit Line 310 and Complement Bit Line 311 rise up to the sub-VDD target level by time t3, when Charge 322 is de-asserted. True Bit Line 310 and Complement Bit Line 311 maintain the sub-VDD voltage level due to the assertion of Maintenance 323 enabling Q201 and Q203. Maintenance 323 remains asserted, thereby maintaining the current pre-charge phase, until a next read phase begins.

It is noted that Chart 300 is merely an example. The illustrated waveforms are simplified to present the disclosed concepts. In other embodiments, the waveforms may vary dependent on raise and fall times of the associated logic circuits, as well as other influencing factors such as inherent impedances within the circuits, operating voltages and temperatures, and the like.

Figure 4:
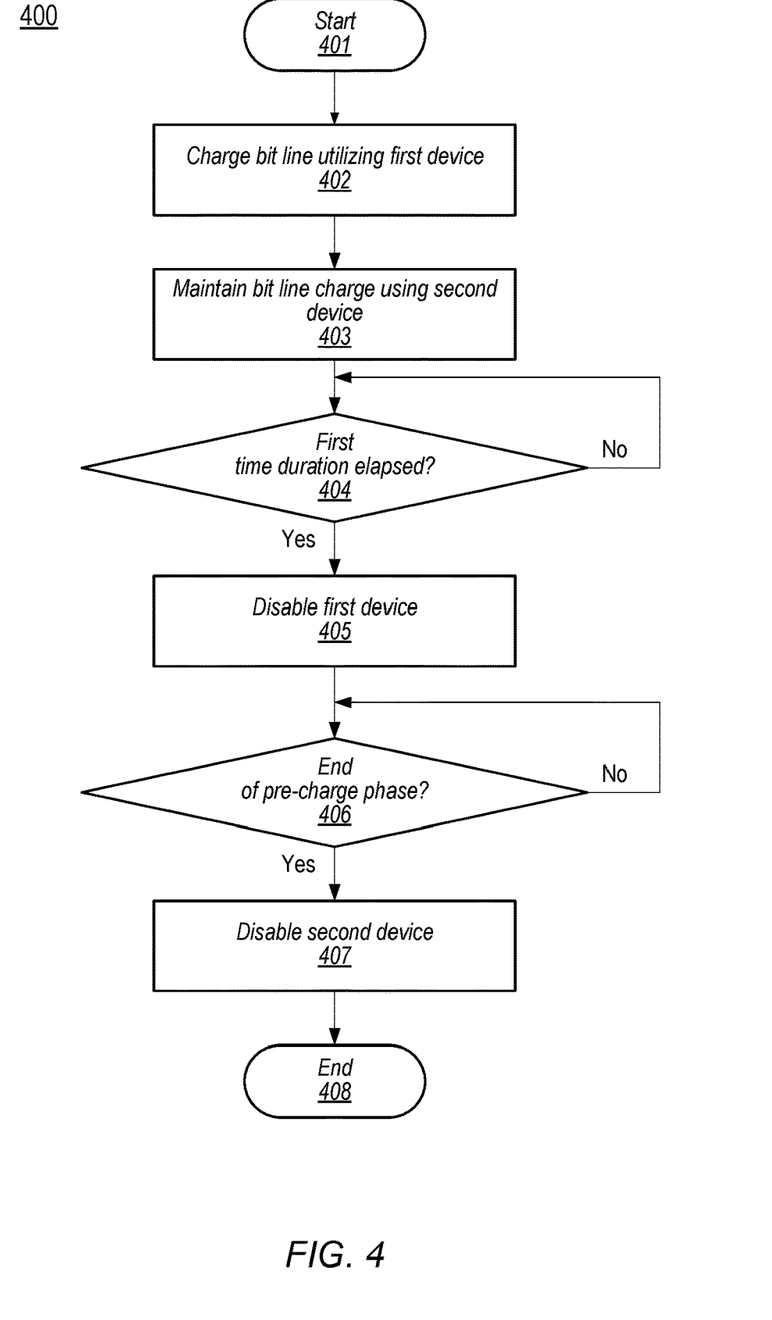
FIG. 4 illustrates a flowchart for an embodiment of a method for pre-charging a bit line.

Moving now to FIG. 4, a flowchart for an embodiment of a method for pre-charging a bit line is illustrated. Method 400 may be applied to a pre-charge circuit, such as, for example, Pre-charge Circuit 102 in FIG. 1 and Pre-charge Circuit 200 in FIG. 2. Referring collectively to FIGS. 1 and 4, Method 400 begins in block 401.

A bit line is charged utilizing a first device (block 402). In the illustrated embodiment, in response to a beginning of pre-charge phase, True Bit Line 110 is charged, by Pre-charge Circuit 102, to a predetermined voltage level. In some embodiments, the voltage level may be a sub-VDD voltage level, less than a voltage level of the power supply signal, VDD 120. Pre-charge Circuit 102 enables Current Source 103a, thereby providing current to charge True Bit Line 110 to the sub-VDD target voltage. Current Source 103a may, in some embodiments, be implemented using transconductance devices, such as, e.g., LVT CMOS transistors such as Q202 and Q204 illustrated in FIG. 2. In the illustrated embodiment, Complement Bit Line 111 is charged in parallel with True Bit Line 110. Current Source 103a is designed to source enough current to both True Bit Line 110 and Complement Bit Line 111 within a particular amount of time, less than a duration of a pre-charge phase.

The charge on the bit line is maintained using a second device (block 403). Pre-charge Circuit 102 enables Current Source 103b to provide adequate current to compensate for an amount of leakage current that may flow from True Bit Line 110 and/or Complement Bit Line 111, such as, for example, leakage current from Memory Cells 101, or leakage current from read circuits coupled to the bit lines. Similar to Current Source 103a, Current Source 103b may be implemented as a transconductance device, such as SVT CMOS transistors Q201 and Q203 shown in FIG. 2. Characteristics of the SVT transistor may be based on a type of cell used in Memory Cells 101 and a number of the cells coupled, respectively, to True Bit Line 110 and Complement Bit Line 111. For example, voltage thresholds of Q201 and Q203 may correspond to voltage thresholds of the memory cells. Current Source 103b may remain enabled until a memory cell coupled to True Bit Line 110 and Complement Bit Line 111 is selected for a read or write operation.

Further operations of Method 400 may depend on a first time duration (block 404). As stated above, Current Source 103a is designed to source enough current to charge both True Bit Line 110 and Complement Bit Line 111 to the target sub-VDD voltage level within a first time duration that is less than a duration of a pre-charge phase. This first time duration may be measured beginning at a time when the signals Charge 222 and/or Maintenance 223 are asserted. Current Source 103a may be designed such that the first time duration supports reading of cells in Memory Cells 101 at a particular maximum rate allowed by memory system 100. If the first time duration has elapsed, then the method moves to block 405 to disable the first device. Otherwise, the method remains in block 404 until the first time duration elapses.

The first device is disabled (block 405). After the first time duration has elapsed, Current Source 103a is disabled and doesn't source current to True Bit Line 110 or Complement Bit Line 111 for the remainder of the current pre-charge phase. Current Source 103b, however, remains enabled and continues to source current to replenish charge on True Bit Line 110 or Complement Bit Line 111 that is lost to leakage though the cells in Memory Cells 101.

Continuing operations of the method may depend on a length of the current pre-charge phase (block 406). The length of the current pre-charge phase may depend on a rate at which a selected cell in Memory Cells 101 is being read. If a read operation is beginning, thereby ending the current pre-charge phase, then the method moves to block 407 to disable the Current Source 103b. Otherwise, the method remains in block 406 until the end of the current pre-charge phase.

The second device is disabled (block 407). At the end of the current pre-charge phase, Pre-charge Circuit 102 disables Current Source 103b. True Bit Line 110 and Complement Bit Line 111 are allowed to resolve to a state representative of a data value stored in a selected memory cell. Circuits within Memory System 100 may detect this state and send a corresponding data value to another circuit that had requested the data in the selected cell. The method ends in block 408.

It is noted that Method 400 of FIG. 4 is merely an example. In various other embodiments, more or fewer operations may be included. In some embodiments, operations may be performed in a different sequence, or in parallel.

Figure 5:
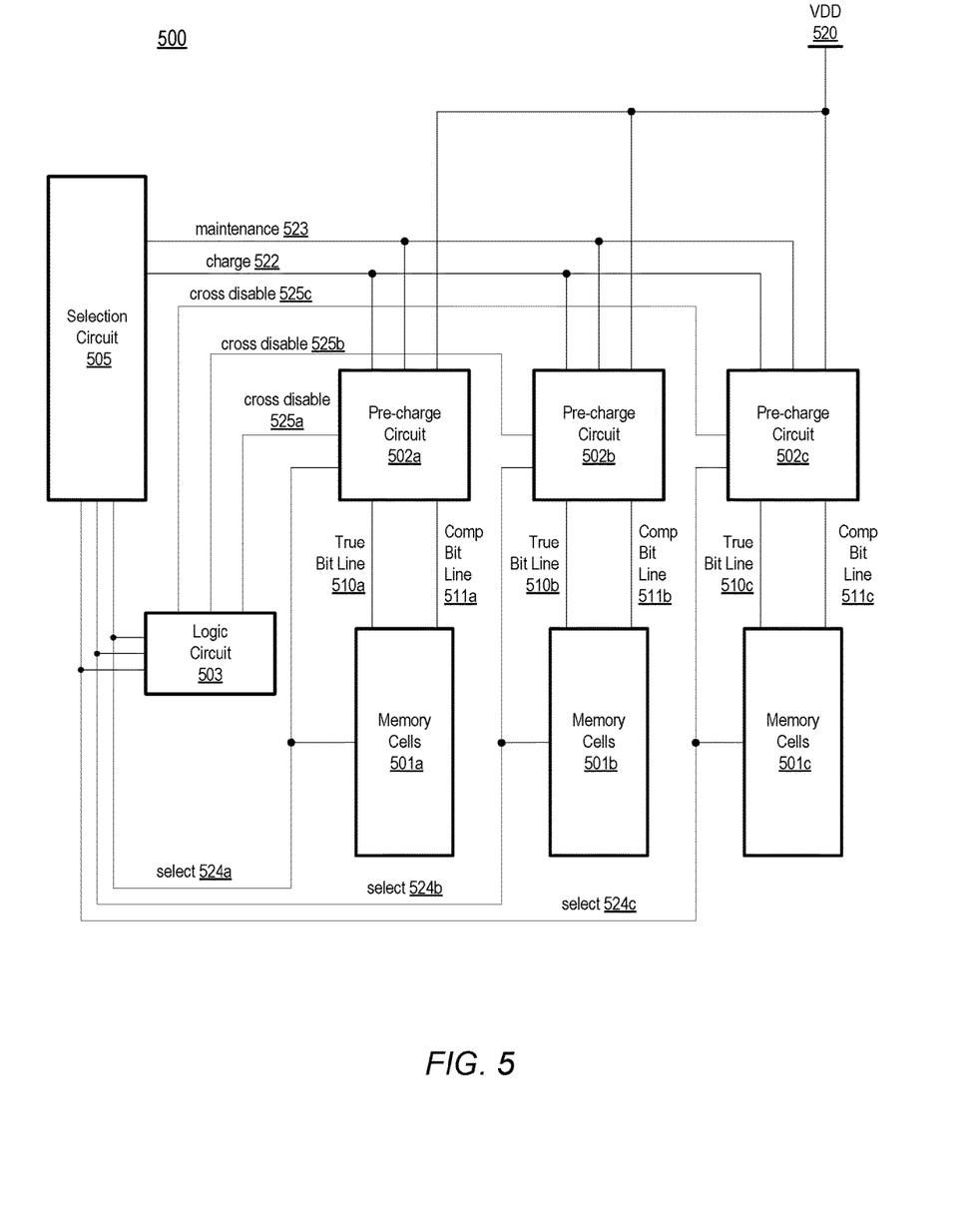
FIG. 5 shows an embodiment of a block diagram of a portion of a memory system.

Method 400 may be applied to multiple pre-charge circuits in an integrated circuit (IC) with multiple groups of memory cells, each group coupled to a respective pre-charge circuit. FIG. 5 shows such an IC. In the illustrated embodiment, IC 500 includes three groups of memory cells, Memory Cells 501a though 501c, each one coupled to a respective Pre-charge Circuit 502a through 502c. Selection Circuit 505 is coupled to each Pre-charge Circuit 502a-502c via signals Charge 522 and Maintenance 523. Each of Memory Cells 501a-501c is coupled to Selection Circuit 505 via a respective Select signal 524a-524c. Selection Circuit 505 is also coupled, via Select signals 524a-524c, to Logic Circuit 503, which is used to generate signals Cross Disable 525a-525c. Pre-charge Circuits 502a-502c are coupled to power supply signal VDD 520. In various embodiments, IC 500 may correspond to a system-on-chip processor for a mobile device, a central processing unit for a computer system, such as a desktop or laptop, or various other types of computing devices. IC 500 may include various other functional circuits that are not illustrated, such as one or more processing cores, clock generation circuits, power management circuits, and the like.

Memory Cells 501a-501c, in the illustrated embodiment, each correspond to a group of memory cells, such as a column of cells coupled to common bit lines. The respective Pre-charge Circuit 502a-502c charges respective bit lines (True Bit Lines 510a-510c and Complement (Comp) Bit Lines 511a-511c) if a cell in a corresponding Memory Cells 501a-501c is selected for a read operation in an upcoming read phase. Each of Pre-charge Circuits 502a-502c may function as described above for Pre-charge Circuit 102 and Pre-charge Circuit 200 in FIGS. 1 and 2, respectively.

In the illustrated embodiment, Selection Circuit 505 includes logic circuits for generating various control signals such as Charge 522, Maintenance 523, and Select signals 524a-524c. Selection Circuit 505 asserts one of Select signals 524a-524c to enable one of Memory Cells 501a-501c for a read operation. The assertion of the one Select signal 524a-524c is based on an address or addresses that may be included as part of a read operation. After a completion of a read operation, Selection Circuit 505 generates the appropriate signals to enable a pre-charge phase for Pre-charge Circuits 502a-502c by asserting Charge 522 and Maintenance 523. Selection Circuit 505 may, in some embodiments, include timer or counter circuits for determining a first time duration for asserting Charge 522, and de-assert Charge 522 once the first time period has elapsed. Maintenance 523 may remain asserted until a next read operation is received for one of Memory Cells 501a-501c. In various embodiments, Selection Circuit 505 may be included in a memory controller circuit, in an address decoder circuit, distributed among Pre-charge Circuits 502a-502c, be included within other circuits in IC 500, or a combination thereof.

Logic Circuit 503, in the illustrated embodiment, asserts one or more of Cross Disable 525a-525c for any corresponding Pre-charge Circuit 502a-502c that is not currently a part of an active read operation, and de-assert the corresponding Cross Disable 525a-525c for any corresponding Pre-charge Circuit 502a-502c that is not part of an active read operation. Accordingly, Logic Circuit 503 de-asserts a particular one of Cross Disable 525a-525c corresponding to a Pre-charge Circuit 502a-502c that is a part of an active read operation. Logic Circuit 503 may include one or more logic gates for asserting a respective one of Cross Disable 525a-525c based on respective states of Select signals 524a-524c. These logic circuits included in Logic Circuit 503 may be included as part of Selection Circuit 505 or implemented as a separate circuit block.

It is noted that IC 500 is an example of an integrated circuit that utilizes pre-charge circuits such as the embodiments disclosed herein. Other embodiments may include different numbers of memory cells and/pre-charge circuits. Additional circuits and signals may be included in some embodiments.

Figure 6:
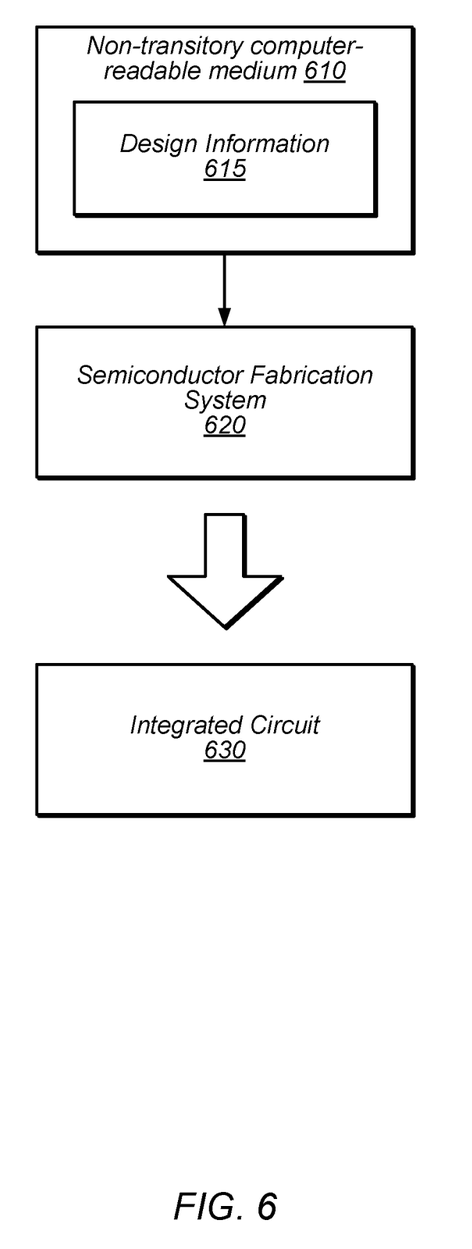
FIG. 6 is a block diagram depicting an example computer-readable medium, according to some embodiments.

FIG. 6 is a block diagram illustrating an example non-transitory computer-readable storage medium that stores circuit design information, according to some embodiments. The embodiment of FIG. 6 may be utilized in a process to design and manufacture integrated circuits, such as, for example, IC 500 of FIG. 5. In the illustrated embodiment, semiconductor fabrication system 620 is configured to process the design information 615 stored on non-transitory computer-readable storage medium 610 and fabricate integrated circuit 630 based on the design information 615.

Non-transitory computer-readable storage medium 610, may comprise any of various appropriate types of memory devices or storage devices. Non-transitory computer-readable storage medium 610 may be an installation medium, e.g., a CD-ROM, floppy disks, or tape device; a computer system memory or random access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. Non-transitory computer-readable storage medium 610 may include other types of non-transitory memory as well or combinations thereof. Non-transitory computer-readable storage medium 610 may include two or more memory mediums which may reside in different locations, e.g., in different computer systems that are connected over a network.

Design information 615 may be specified using any of various appropriate computer languages, including hardware description languages such as, without limitation: VHDL, Verilog, SystemC, SystemVerilog, RHDL, M, MyHDL, etc. Design information 615 may be usable by semiconductor fabrication system 620 to fabricate at least a portion of integrated circuit 630. The format of design information 615 may be recognized by at least one semiconductor fabrication system, such as semiconductor fabrication system 620, for example. In some embodiments, design information 615 may include a netlist that specifies elements of a cell library, as well as their connectivity. One or more cell libraries used during logic synthesis of circuits included in integrated circuit 630 may also be included in design information 615. Such cell libraries may include information indicative of device or transistor level netlists, mask design data, characterization data, and the like, of cells included in the cell library.

Integrated circuit 630 may, in various embodiments, include one or more custom macrocells, such as memories, analog or mixed-signal circuits, and the like. In such cases, design information 615 may include information related to included macrocells. Such information may include, without limitation, schematics capture database, mask design data, behavioral models, and device or transistor level netlists. As used herein, mask design data may be formatted according to graphic data system (GDSII), or any other suitable format.

Semiconductor fabrication system 620 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 620 may also be configured to perform various testing of fabricated circuits for correct operation.

In various embodiments, integrated circuit 630 is configured to operate according to a circuit design specified by design information 615, which may include performing any of the functionality described herein. For example, integrated circuit 630 may include any of various elements shown or described herein. Further, integrated circuit 630 may be configured to perform various functions described herein in conjunction with other components. Further, the functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
    a plurality of memory cells, wherein a given memory cell of the plurality of memory cells is coupled to a true bit line, a complement bit line, and a power supply signal; and
    a pre-charge circuit configured to:
        charge, using a first current for a first duration, the true bit line and the complement bit line to a voltage level that is less than a voltage level of the power supply signal; and
        maintain, using a second current for a second duration that is different than the first duration, the voltage level on the true bit line and the complement bit line;
        wherein the first and second currents vary in magnitude.

2. The apparatus of claim 1, wherein to charge the true bit line and the complement bit line, the pre-charge circuit includes respective transconductive devices coupled to the true bit line and to the complement bit line.

3. The apparatus of claim 2, wherein the pre-charge circuit includes a first n-channel metal-oxide semiconductor (NMOS) transistor and a second NMOS transistor, both coupled to the true bit line, wherein a voltage threshold of the first NMOS transistor is less than a voltage threshold of the second NMOS transistor, and wherein to charge the true bit line, the pre-charge circuit is further configured to enable the first NMOS transistor for the first duration, and wherein to maintain the voltage level on the true bit line and the complement bit line, the pre-charge circuit is further configured to enable the second NMOS transistor for the second duration.

4. The apparatus of claim 1, wherein the pre-charge circuit includes a timer circuit configured to indicate an end of the first duration.

5. The apparatus of claim 1, wherein the pre-charge circuit is further configured to charge the true bit line and the complement bit line to the voltage level in response to a determination that a particular memory cell of the plurality of memory cells has completed a read operation.

6. The apparatus of claim 1, wherein the pre-charge circuit includes a pair of cross-coupled devices, wherein each device of the pair of cross-coupled devices is coupled to the true bit line, the complement bit line, and the power supply signal, and wherein the pre-charge circuit is further configured to decouple each device of the pair of cross-coupled devices from the power supply signal in response to an assertion of a disable signal.

7. The apparatus of claim 6, wherein the pre-charge circuit further includes at least one power gate device, and wherein to decouple each device of the pair of cross-coupled devices, the pre-charge circuit is further configured to disable the at least one power gate device using the disable signal.

8. A method, comprising:
charging, by a first device included in a pre-charge circuit, for a first duration, a true bit line coupled to one or more memory cells of a memory array to a particular voltage level that is less than a voltage level of a power supply signal coupled to the one or more memory cells, wherein the first duration is less than a duration of a pre-charge phase of a memory access cycle; and
maintaining the particular voltage level on the true bit line, by a second device included in the pre-charge circuit, for the duration of the pre-charge phase of the memory access cycle.

9. The method of claim 8, further comprising coupling, by the pre-charge circuit, the true bit line to a complement bit line for the duration of the pre-charge phase, wherein the complement bit line is coupled to the one or more memory cells of the memory array.

10. The method of claim 8, wherein maintaining the particular voltage level on the true bit line comprises sourcing a maintenance current, via the second device, to the true bit line that is substantially equal to an amount of leakage current flowing from memory cells coupled to the true bit line.

11. The method of claim 10, wherein charging the true bit line to the particular voltage level comprises sourcing a charge current, via the first device, wherein a value of the charge current is greater than a value of the maintenance current.

12. The method of claim 8, wherein the pre-charge phase begins at an end of a previous read operation on a memory cell of the one or more memory cells.

13. The method of claim 12, further comprising:
starting a measurement of the first duration in response to determining that the pre-charge phase has begun; and
ceasing charging of the true bit line by the first device in response to a determination that the first duration has elapsed.

14. The method of claim 8, wherein a voltage threshold of the first device is less than a voltage threshold of the second device.

15. An apparatus, comprising:
a plurality of memory cells, wherein a given memory cell of the plurality of memory cells is coupled to a bit line and a power supply signal; and
a pre-charge circuit coupled to the bit line, wherein the pre-charge circuit is configured to source first and second currents to the bit line to pre-charge the bit line to a voltage level that is less than a voltage level of the power supply signal, wherein the first and second currents vary in magnitude and duration.

16. The apparatus of claim 15, wherein a magnitude of the first current is greater than a magnitude of the second current, and wherein a duration of the first current is less than a duration of the second current.

17. The apparatus of claim 16, wherein the pre-charge circuit is further configured to maintain the voltage level on the bit line by sourcing the second current with a magnitude that is substantially equal to an amount of leakage current flowing from the plurality of memory cells.

18. The apparatus of claim 16, wherein the pre-charge circuit includes a timer circuit configured to indicate an end of the duration of the first current.

19. The apparatus of claim 15, wherein the pre-charge circuit includes:
a first n-channel metal-oxide semiconductor (NMOS) transistor configured to source the first current; and
a second NMOS transistor configured to source the second current, wherein a voltage threshold of the second NMOS transistor is greater than a voltage threshold of the first NMOS transistor.

20. The apparatus of claim 15, wherein the pre-charge circuit is further configured to source the first and second currents in response to a determination that at least one memory cell of the plurality of memory cells has reached an end of a read operation.

* * * * *